(12) United States Patent
Gleason et al.

(10) Patent No.: US 11,367,812 B2
(45) Date of Patent: Jun. 21, 2022

(54) LAYERED PHOSPHOR IN GLASS

(71) Applicant: Ferro Corporation, Mayfield Heights, OH (US)

(72) Inventors: Cody J. Gleason, Solon, OH (US); Srinivasan Sridharan, Strongsville, OH (US); George E. Sakoske, Independence, OH (US); Ellen S. Tomey, Princeton Junction, NJ (US); Chao Ma, Collegeville, PA (US); Jackie D. Davis, Cleveland, OH (US); Yi Yang, Fort Washington, PA (US); Stanley Wang, Taipei (TW)

(73) Assignee: Ferro Corporation, Mayfield Heights, OH (US)

( * ) Notice: Subject to any disclaimer, the term of this patent is extended or adjusted under 35 U.S.C. 154(b) by 65 days.

(21) Appl. No.: 16/891,527

(22) Filed: Jun. 3, 2020

(65) Prior Publication Data
US 2020/0388730 A1 Dec. 10, 2020

Related U.S. Application Data

(60) Provisional application No. 62/857,422, filed on Jun. 5, 2019.

(51) Int. Cl.
*H01L 33/50* (2010.01)
*H01L 33/48* (2010.01)

(52) U.S. Cl.
CPC .......... *H01L 33/507* (2013.01); *H01L 33/501* (2013.01); *H01L 33/483* (2013.01)

(58) Field of Classification Search
CPC .... H01L 33/507; H01L 33/501; H01L 33/483
See application file for complete search history.

(56) References Cited

U.S. PATENT DOCUMENTS

| | | | |
|---|---|---|---|
| 10,158,057 B2* | 12/2018 | Orsley | ...................... C03C 8/24 |
| 2007/0064131 A1* | 3/2007 | Sawanobori | .......... H01L 33/505 348/294 |
| 2012/0012865 A1* | 1/2012 | Li | ............................ F21K 9/64 257/88 |
| 2012/0107622 A1* | 5/2012 | Borrelli | ................. C09K 11/02 428/428 |

OTHER PUBLICATIONS

Yang Peng, Sinmin Wang, Ruixin Li, Hong Li, Hao Cheng, Mingxiang Chen, and Sheng Liu, "Luminous efficacy enhancement of ultraviolet-excited white light-emitting diodes through multilayered phosphor-in-glass," Appl. Opt. 55, 4933-4938 (2016) (Year: 2016).*

(Continued)

*Primary Examiner* — Mark W Tornow
(74) *Attorney, Agent, or Firm* — Rankin, Hill & Clark LLP; Christopher Jan Korff

(57) ABSTRACT

A phosphor in glass (PiG) cover is provided to modulate the color emitted from an LED chip. The PiG cover includes an active layer including glass and phosphor, and a secondary layer including glass and free of phosphor. The active layer is stacked on the secondary layer to form the PiG cover. Alternately the PiG includes an active layer sandwiched between two secondary layers. Two or more active layers can be stacked to each other or disposed side-by-side. An LED chip is arranged under the PiG cover to form an LED package.

18 Claims, 4 Drawing Sheets

(56) References Cited

OTHER PUBLICATIONS

Yang Peng, Ruixin Li, Xing Guo, Huai Zheng, and Mingxiang Chen, "Optical performance improvement of phosphor-in-glass based white light-emitting diodes through optimized packaging structure," Appl. Opt. 55, 8189-8195 (2016) (Year: 2016).*

Simin Wang, Xing Chen, Mingxiang Chen, Huai Zheng, Hongru Yang, and Sheng Liu, "Improvement in angular color uniformity of white light-emitting diodes using screen-printed multilayer phosphor-in-glass," Appl. Opt. 53, 8492-8498 (2014) (Year: 2014).*

Seungryeol Yi, Woon Jin Chung & Jong Heo, "Phosphor-in-glasses composites containing light diffusers for high color uniformity of white-light-emitting diodes," Journal of Solid State Lighting vol. 2, Article No. 8 (2015) (Year: 2015).*

Kim, et al. "Review—Phosphor Plates for High-Power LED Applications: Challenges and Opportunities toward Perfect Lighting", ECS Journal of Solid State Science and Technology, vol. 7 pp. R3134-R3147 (2018).

Zhang et al., "A new-generation color converter for high-power white LED: transparent Ce3+:YAG phosphor-in-glass," Laser Photonics Rev. vol. 8, No. 1, pp. 158-164 (2014).

You et al., "Light extraction enhanced white light-emitting diodes with multi-layered phosphor configuration," Opt. Express 18, pp. 5055-5060 (2010).

Ding et al., "Improving the optical performance of multi-chip LEDs by using patterned phosphor configurations," Opt. Express 26, A283-A292 (2018).

\* cited by examiner

LAYERED PHOSPHOR IN GLASS

CROSS-REFERENCE TO RELATED APPLICATIONS

This application claims priority to U.S. Application No. 62/857,422 filed 5 Jun. 2019, which is expressly incorporated herein by reference.

FIELD

The present subject matter relates to glass components containing phosphor for use in optical, glass color applications and related methods.

BACKGROUND

Transparent layers and compositions are often used in optical applications, wherein light is transmitted through a layer of transparent material for viewing. Several factors are often considered in formulating such transparent layers for specific applications. These factors include for example, optimizing the percent transmission of light through the transparent layer, and increasing the functionality of the transparent layer for altering, e.g. upconverting or polarizing, the light as it passes through the transparent layer. Transparent layers are typically used in various optical applications such as display screens in televisions and smartphones, and light emitting diodes (LEDs), for example. Due to much lower power consumption and longer life compared to other lighting sources, LEDs are increasingly utilized in demanding lighting applications such as automotive headlights and residential lighting. The conversion to using LEDs is due to advances in producing high brightness blue LEDs, which generally emit more lumens per watt than LEDs emitting other colors (e.g. red, orange, yellow, and green).

One disadvantage of using high output blue LEDs as general purpose lighting is that blue LEDs undesirably emit a cold blue light. Therefore, development of blue LEDs has partially focused on converting the blue light to white light having different color temperatures, e.g. cool white light (blueish hue with color temperature approximately 10000° K) to warm white light (yellowish hue with color temperatures approximately 3000° K).

One method of converting blue light from an LED to white light is by transmitting the blue light through a phosphor material capable of emitting yellow light. The conversion from blue to white light proceeds when a portion of the blue light from the LED chip is absorbed by the phosphor material and the absorbed energy excites the phosphor and causes the phosphor to emit yellow light. The yellow light emitted from the phosphor combines with an unabsorbed portion of the blue light transmitted through the phosphor material, to produce white light of varying color tones.

A conventional phosphor material used to produce white light from a blue LED is $Ce^{3+}$ doped Yttrium Aluminum Garnet (YAG) crystals represented by the chemical formula $Y_3Al_5O_{12}$. This and other phosphors are being used in LED packages that include an organic silicone polymer encapsulant that surrounds the LED chip. The phosphor is included in the form of a disc covering the organic silicone, or is dispersed into a silicone polymer matrix and formed into a composite dome or encapsulant for the LED chip.

However, the organic silicone used as the matrix material for the LED package tends to degrade over time from exposure to light and heat produced by the LED chip. Such degradation of the silicone results in undesirable discoloration of the silicone and reduces the output, and hence the useful lifetime, of the LED package.

In the case of $Ce^{3+}$ doped YAG phosphor, which are dispersed in the silicone dome/encapsulant, blue LED chips emit light at ~460 nm wavelength. This light goes through the silicone-phosphor material. The phosphor absorbs part of this blue light and due to fluorescence, emits yellow light in a broad band centered around 550 nm. The blue light (~460 nm) transmitted through the silicone-phosphor material is mixed with the yellow light (~550 nm) emitted by the phosphor, and thereby produces white light. In general this white light has an undesirable cool color temperature.

In this regard, the white light emitted by the LED package has an undesirable cool color temperature (i.e. blueish), instead of a desired warm color temperature (i.e. yellowish) similar to traditional incandescent light bulbs. Further, organic silicone used as a polymer matrix degrades during the lifetime of the LED, causing a shift in color shade and/or output of the LED package and thereby decreases the useful lifetime of the LED package. Therefore an improvement in the technology is needed.

In order to produce warm white light, additional red shift is needed from the phosphor. For this, various phosphor technologies, such as mixing of different yellow and red phosphors, and phosphors based on host crystals other than YAG, such as La-AG, Gd-AG, Lu-AG, (where "AG" means "aluminum garnet") nitrides and oxynitrides, oxides, oxyhalides and halides are being pursued with different activators such as $Ce^{3+}$, $Eu^{2+}$, $Yb^{2+}$ so on.

BRIEF DESCRIPTION OF THE DRAWINGS

These, as well as other features, aspects, and advantages of the present subject matter, will be more completely understood and appreciated by referring to the following more detailed description of the exemplary embodiments of the present subject matter in conjunction with the accompanying drawings.

DETAILED DESCRIPTION OF THE EMBODIMENTS

Figure 1:
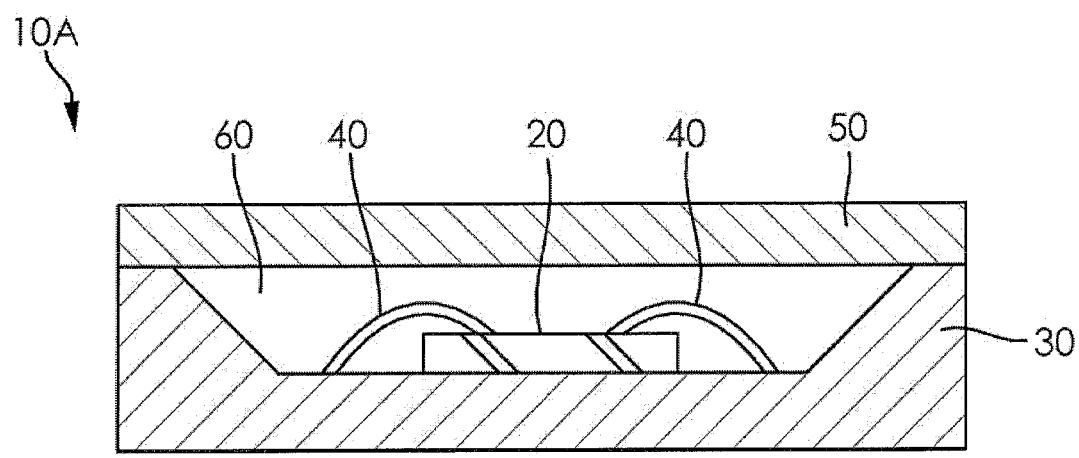
FIG. 1 is a cross-sectional drawing of a LED package in accordance with the present subject matter.

Phosphor in glass (PiG) covers have been employed for covering LED chips in LED packages. The PiG cover includes phosphors dispersed in a glass matrix, which phosphors are used for the conversion of blue light emitted by the LED chip, to an overall white light emitted by the LED package. Such LED packages are referred to as phosphor converted light emitting diodes (pc-LEDs). Solid state lighting has seen tremendous growth recently, especially in pc-LEDs. The glass matrix systems used in pc-LEDs have superior thermal, mechanical, and chemical properties that protect the LED chips from the external environment, when compared with typical organic resins such as silicone. The glass has been used as the matrix material because the glass matrix may not experience discoloration from degradation as is typically associated with silicone.

However, these PiG covers often require surface modification in order to modify their ability to modify the light emitted from the LED chip. This modification is conventionally performed directly on the surface of the PiG cover, which typically contains a homogeneous distribution of phosphor material within the glass matrix. Thus, any surface modification performed on the PiG cover, such as polishing, necessarily abrades away some of the phosphor material dispersed therein. This surface modification therefore is undesirable, because it causes a waste of some of the phosphor material within the cover, which phosphor material can be relatively expensive compared to the glass matrix. As such, there is room for improvement in such PiG covers.

The present invention provides a PiG cover, and related methods of manufacture and use. The PiG cover includes several layers of varying materials to provide cost reduction, improved light extraction, and a controlled level of surface roughness for the PiG cover. The PiG cover can be used in an LED package or in a laser diode package.

The invention employs the use of tape/slip casting of multiple layers of material in the manufacturing process of the PiG cover, which can then be subjected to surface modification and employed as a cover in an LED package or a laser diode package to covert the color of light emitted from the LED or laser diode to a more desirable color.

The invention improves upon the design of conventional PiG covers with respect to their formation by pressing PiG material into the form of a pellet, followed by firing the pellet in a furnace to form the PiG cover. This formation method does not provide for accurate sizing or precise surface features on the PiG cover, and therefore normally requires extensive surface polishing and other processing of the cover to attain a desired level of surface roughness, a desired size and shape, and/or other desired characteristics of the cover. The present invention allows for a precise control of the surface roughness of the PiG cover, which will allow for increase light extraction by including either smooth surfaces for on-chip systems or rougher surfaces for remote-chip systems. In addition, the present invention may improve the light extraction of the PiG systems, by the use of a secondary phosphor layer to color correct the emission spectra.

The invention provides a PiG cover for an LED chip as depicted for example, in FIG. 1, or a PiG cover for a laser diode (not shown). FIG. 1 depicts an LED package 10A including an LED chip 20 on a substrate 30. The LED chip 20 is connected by wire bonds 40 to a power source (not shown). The LED package 10A includes a PiG cover 50 over the LED chip 20, through which light from the LED chip 20 is transmitted and is converted from blue light to white light of various color temperatures. The PiG cover 50 may be sealed to the substrate 30 to provide a vacuum/inert atmosphere 60 around the LED chip 20 and wire bonds 40.

The PiG cover may be produced using a tape/slip casting method involving stacking two or more green tape layers, and subjecting the green tape layers to heat and/or pressure to laminate the layers together to form the cover. The PiG cover includes a glass-phosphor active layer and one or more glass secondary layers selectively included with the active layer to provide a desired characteristic to the cover.

The secondary layers may be arranged on either side of the phosphor active layer to define the two major exterior surfaces of the PiG cover. These secondary layers may include glass material and be devoid of phosphors, and therefore may be less costly to produce than the active layer, which includes the relatively more expensive phosphors.

For various LED and laser diode applications, surface roughness is an important parameter. Typical PiG systems are polished to obtain a certain level of smoothness. This results in not only a costly production sequence, but also in a loss of valuable material in the form of the phosphor itself. The present PiG cover includes an active layer sandwiched between two secondary layers (e.g. glass only layers), which can provide a single sintered body that can be polished without any loss of expensive phosphor. This embodiment may include a 120 μm thick active layer and two secondary layers, each at 25-100 μm thickness. These two secondary layers may be partially polished away. This simple yet practical approach is ideal from a cost saving perspective.

Figure 2:
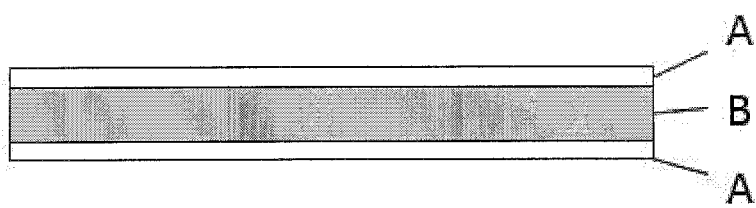
FIG. 2 is a cross-sectional drawing of a phosphor in glass cover for an LED package in accordance with the present subject matter.
Figure 3:
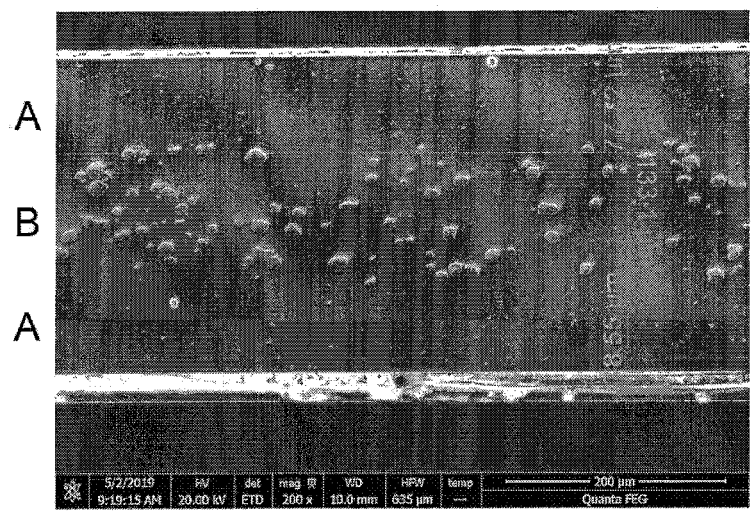
FIG. 3 is an SEM image of a cross-section of an example phosphor in glass cover for an LED package in accordance with the present subject matter.

Therefore, in one embodiment as depicted in FIGS. 2 and 3, the cover includes an interior PiG active layer B and two exterior secondary layers A arranged on either side of the active layer B. The exterior secondary layers A may be free of phosphors and otherwise include a glass component. The cover may be surface modified (e.g. polished), and such surface modification may only affect the exterior secondary layers A, and not impinge upon the interior active layer B. As such, the surface modification can be carried out without sacrificing or wasting any of the phosphor (particles of phosphor depicted in FIG. 3) contained in the active layer B. This allows polishing of the cover without the loss of expensive phosphor.

Another application of this technology is to impart or improve surface roughness into a given LED or laser diode system. Imparting surface roughness to an LED or laser diode cover can be obtained by using larger glass particles which upon firing leave a non-uniform surface and can contribute to a higher light extraction. For on-chip LED systems, the smoother the surface in contact with the LED chip, the better the efficiency of the overall system may be, as less light is lost to reflection. The surface roughness of these systems can be improved by using a very fine particle size distribution<1.

Figure 4A:
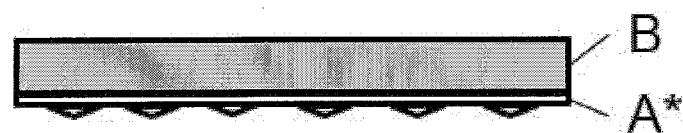
FIGS. 4A-4C are cross-sectional drawings of LED chips and phosphor in glass covers in accordance with the present subject matter.
Figure 4A:
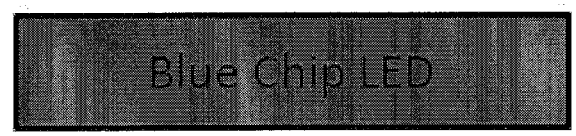
Figure 4B:
Figure 4B:
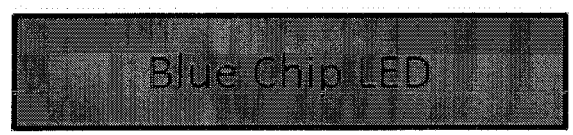
Figure 4C:
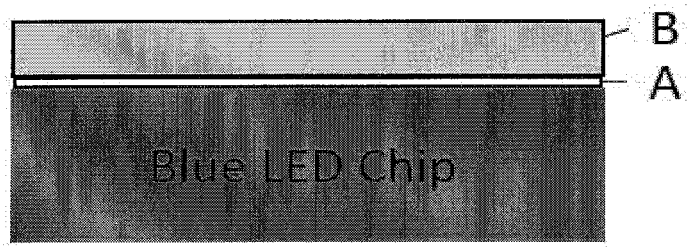

Accordingly, in another embodiment as depicted in FIGS. 4A-4C, the cover includes only one secondary layer A, although another secondary layer could be included. In FIG. 4B, the secondary layer A is arranged on a side of the active layer B opposite from the blue-light-emitting LED chip. In FIGS. 4A and 4C, the secondary layer A is arranged on the same side of the active layer B as the blue-light-emitting LED chip. In FIGS. 4A and 4B, the secondary layer A is shown to have a rough surface depicted schematically by white triangles each with an apex pointing away from active layer B. The rough surface is directed either toward the LED chip (FIG. 4A), or away from the LED chip (FIG. 4B). This rough surface may be maintained after lamination of the tape layers. Either cover from FIG. 4A or 4B could be included in either an on-chip system or a remote-chip system. As seen in FIG. 4C, the cover may be incorporated with the LED chip as an on-chip system. The system shown in FIG. 4C is an on-chip system. The secondary layer A is shown to have smooth surfaces, which may be desired in such a system for increasing light extraction from the LED Chip. These embodiments allow for the formation of surface roughness on the cover, which may improve light extraction in some cases. The surface roughness can be imparted during lamination by a textured press contacting the secondary layer.

The surface roughness could also be imparted on the secondary layer by using a green tape including a crystallizing glass, crystalline particles, or glass frit that have a high melting point, or by using larger particles of glass frit. In this way, the glass frit of crystalline particles may not completely melt during lamination of the various tape layers and thus may produce surface roughness on the secondary layer. Alternatively, the surface roughness of the secondary layer may simply be at a desirable level after lamination, such that the cover simply is not polished, and thus retains that desired level of surface roughness.

Figure 5A:
FIGS. 5A-5C are cross-sectional drawings of phosphor in glass active layers in accordance with the present subject matter.
Figure 5B:
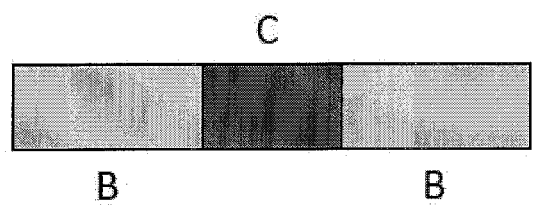
Figure 5C:
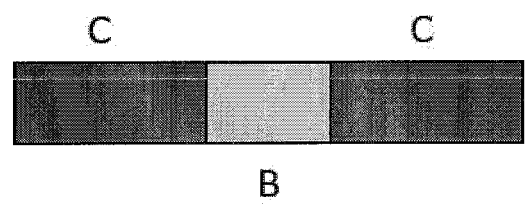

In another embodiment, the cover may include multiple active layers with different types of phosphors. The different active layers may be used for color correction of the LED package, and may result in only limited loss of efficiency when compared to conventional mixing of different phosphors in a single layer. This is depicted in FIGS. 5A-5C for example, where a first active layer(s) B is interposed with a second active layer(s) C. The first active layer B may include yellow converting phosphors, while the second active layer C may include red converting phosphors. This embodiment may allow a complimentary conversion of blue light, and may be combined with the other embodiments including secondary layers A. This embodiment is thus amenable to designing unique geometries of various phosphor active layers.

FIG. 5A includes a first active layer B stacked with a second active layer C on top of each other, wherein a LED chip or laser diode would be positioned underneath the active layers. In this approach, the second active layer C is filled with a red phosphor and is used for color correction. Two separate layers of phosphors may be more efficient in terms of light production, than the mixing of the two phosphors in a single layered system. Not only is there distinct separation with regards to the two layers, but there is also precise thickness control available for rapid investigations regarding efficiency. It is also believed that this design will reduce the junction temperature as well, thus increasing the efficiency of the phosphors. In short this process allows us to retain a large amount of internal efficiency, which is likely due to a decrease in interference pathways while maintaining an easy to use process.

FIGS. 5B and 5C include a first active layer B arranged side-by-side with a second active layer C, wherein a LED chip or laser diode would be positioned underneath the active layers. Rather than just mixing two phosphors together, this approach seeks to maintain strict independence of the phosphors within the same layer. This can be achieved through the lamination process associated with slip casting, where the two tapes are placed slightly overlapping which allows for intimate bonding after the firing process. This process is also amenable to the usage of polishing as well, which would reduce the possibility of defects in the final product.

The green ceramic tapes of the active layers and the secondary layers are formed by preparing a ceramic slurry comprising a glass component, a binder, a plasticizer, and a solvent. For the ceramic slurry used to form the PiG active layer, the glass component may crystalize to produce a phosphor, or for non-crystallizing glass component, the ceramic slurry can additionally include as separately added phosphor.

The slurry is cast to a specified size and shape, and then dried to substantially remove the solvent from the slurry, thereby producing the green tape. The green tape can be further modified to produce a green body with a desired size and shape, such as by cutting, stamping, grinding, etc. A stack of green tapes are then laminated by pressing and/or firing. This stacking of green tapes allows for customization of the various tape layers to produce a fired PiG cover having desired characteristic based upon the aggregate or individual characteristics of the various layers. Moreover, PiG covers can be assembled modularly from any number and types of green tapes, which allows for easy modification to the types of covers that can be produced. Upon firing the tapes, the organic components in the green tapes volatize to produce a densified and sintered ceramic body as the cover. Subsequent surface modification to the cover can be performed, such as polishing.

The ceramic slurry can include from about 45-63 weight percent (wt %) glass component, about 16-30 wt % solvent, about 6-14 wt % thermoplastic polymer, and about 2-10 wt % plasticizer. In one embodiment the slurry includes from about 45-58 wt % glass component, about 16-25 wt % solvent, about 6-10 wt % thermoplastic, and about 2-6 wt % plasticizer. In another embodiment, the ceramic slurry includes about 2-63 wt % glass component, about 18-30 wt % solvent, about 8-14 wt % thermoplastic, and about 5-10 wt % plasticizer. The sintered active layer may additionally include 5-95 wt % phosphor based on the total wt % of the active layer. This amount of phosphor in the active layer may be separately included, or may crystallize out of the glass component when the active layer is fired.

The green ceramic tapes may be fired at temperatures below about 900° C., for example from about 800-900° C., or about 850° C.

The organic portion of the ceramic slurry includes a thermoplastic polymer resin, a plasticizer, solvent and optionally a dispersant (wetting agent). In one embodiment, the slurry comprises about 25 wt % to about 55 wt %, preferably about 30 wt % to about 55 wt %, more preferably about 33 wt % to about 47 wt % of the organic portion. During drying of the cast slurry, the solvent is removed by evaporation to form the green ceramic tape. During firing of the green tapes, the remainder of the organics portion (polymer, plasticizer and dispersant) is volatilized leaving only the densified and sintered glass component, and also phosphor for the active layer.

The green tapes include any of a wide variety of thermoplastic polymers. Suitable thermoplastic polymers include polyolefins, polyvinyl chloride, polyvinyl butyral, polyacrylics, polyamides, polyesters, polyphenylene sulfides, polystyrenes, polyoxymethylenes, polyoxyethylenes, and polycarbonates.

The thermoplastic polymer is removed from the green ceramic tapes during the firing step. The thermal removal of thermoplastic polymer from the green tapes may begin at about 200° C. and may be completed at about 450° C.

The type and amount of thermoplastic polymer in the green tapes also affects the removal mechanism and burn out temperature range for the thermoplastic polymer. Processing variables such as firing atmosphere (e.g., air, nitrogen, hydrogen); gas flow rate, heating rate, and sample size also influence the degradation mechanism.

The plasticizer may be any substance known to plasticize a thermoplastic polymer. Useful plasticizers broadly include benzoates, phthalates, and succinates (i.e., esters), for example, dipropylene glycol dibenzoate, dipropylene glycol monobenzoate, propylene glycol dibenzoate, tripropylene glycol dibenzoate, diethylene glycol dibenzoate, diethylene glycol monobenzoate, ethylene glycol dibenzoate, triethylene glycol dibenzoate, dioctyl phthalate, glyceryl ethylhexanoate benzoate, isononyl benzyl succinate, and butyl benzyl phthalate, though others known in the art may be suitable. Broadly, plasticizers sold by Polymer Additives, Inc. Independence Ohio under the Santicizer® trademark are suitable.

A dispersant included in the ceramic slurry may serve to ensure proper wetting of the glass component with the constituents of the organic component such as thermoplastic polymer, plasticizer, and solvent. The dispersant may be a surfactant, having both polar and non-polar functionalities. The slurry may comprise about 0.1 wt % to about 5 wt % of a dispersant.

Suitable dispersants sold under the BYK® or Disperbyk® trademarks from BYK-Chemie of Wesel, Germany, include BYK110 (solution of copolymer with acidic group); BYK 111 (copolymer with acidic groups); BYK-180 (alkylolammonium salt of an acidic polyester). Also suitable are Duomeen® TDO (Akzo Nobel); Solsperse® 36600, a proprietary polymer mixed with aromatic hydrocarbon solvent; Solsperse® 13240, a mixture of polymeric amide and toluene; Solsperse® 20000, polymeric alkoxylate, and Aerosol® TR-70, sodium bistridecyl sulfosuccinate in water and ethanol. The Solsperse® and Aerosol® products are available from the Lubrizol Corporation of Cleveland, Ohio. Suitable wetting agents include Silvet® L-77, which is modified heptamethylsiloxane from Silberline Corporation, Tamaqua, Pa.

The solvent is not particularly limited by the present subject matter. Exemplary solvents included in the ceramic slurry include toluene, ethanol, methanol, methyl isobutyl ketone, methyl ethyl ketone, cyclohexanone and terpineol. Other organic solvents may be suitable.

The organic portion of the ceramic slurry may also contain a tackifying resin. In general, tackifying resins such as alpha methyl styrene resins, polyamide adhesive resins, polyterpene resins, polymerized rosin, rosin esters, styrenated terpene resins, tackifier dispersions and terpene-phenol resins are suitable. The slurry may comprise about 0.1 wt % to about 20 wt % of a tackifying resin.

The glass component in the ceramic slurry may be in the form of glass frit and include any one or more glass components typically used in LED package processing. In environmentally sensitive applications, the glass components may be substantially free of lead and cadmium.

The glass component is configured to provide upon firing, a highly durable glass matrix containing phosphor that does not discolor upon exposure to light or heat, such as light and heat from an LED chip or laser diode. The frit may be of any desired size, such as a D50 of 1-50 µm, preferably 3-30 µm, more preferably 3-20 µm, and most preferably a mixture of different sizes within 1-50 µm as measured by a laser particle size analyzer.

The cover can be formed by sintering glass frit in the various layers of green tape by heating the stack of tapes above the glass transition temperature (Tg) of the glass frit. However, exposing the separately added phosphors that may be present in the green tape to relatively high processing temperatures (e.g. more than about 900° C.) may degrade the fluorescence of the phosphor. In this regard and in one embodiment, the glass component is formulated so that the glass frit can be processed (e.g. sintered) at relatively low temperatures (e.g. less than about 900° C.) to form the PiG active layer. Such low temperature processing may inhibit degradation of the fluorescent properties of the phosphor that may be present in the glass components. In one embodiment, the glass frit has sintering or firing temperatures of less than about 900° C., less than about 850° C., less than 750° C., or less than 650° C.

The particular glass component may be selected based on the desired application of the green tape and be included from about 45-63 wt % in the ceramic slurry. For example, the glass component of the ceramic slurry may contain glasses based on borosilicates, alumino silicates, alkali titanium silicates, alkali titanium vanadium silicates, barium based glasses, calcium based glasses, magnesium based glasses, strontium based glasses, phosphate glasses, zinc based glasses, lithium based glasses and bismuth based glasses. Combinations of the foregoing are possible.

Furthermore, glasses containing various combinations of $Al_2O_3$, $Bi_2O_3$, $SiO_2$, $B_2O_3$, MgO, $TiO_2$, $ZrO_2$, $Li_2O$, $Na_2O$, $K_2O$, BaO, SrO, CaO, MgO, $Nb_2O_5$, $P_2O_5$, $V_2O_5$, $CoO_3$, $Fe_2O_3$, $Cr_2O_3$, CuO, and NiO are also suitable. Tape formulations comprising alkali free or very low alkali glasses and filler comprising quartz, $TiO_2$, $ZrO_2$, and $Al_2O_3$ are also envisioned. Also, mixtures of glassy compositions and crystalline fillers are envisioned.

The glass component is not particularly limited by the present subject matter, and can include oxides that upon firing, form alkali-B—Si—Zn glasses, bismuth-based glasses, lead-based glasses, or alkali-B—Si glasses for example. The fired glass component can be clear or colored.

In several embodiments, the oxide mixture used to form the glass components comprises a mixture of oxides comprising $ZnO$—$B_2O_3$—$SiO_2$. When fired, these oxides form zinc borosilicate glass components generally having a refractive index of about 1.55-1.60. In one embodiment, the mixture of oxides includes about 14-50 mole % ZnO, about 3-28 mole % $B_2O_3$, and about 20-60 mole % $SiO_2$.

In accordance with the present subject matter, additional oxides can be included as follows:

up to about 21 mole % $K_2O$, up to about 25 mole % $Na_2O$, and/or up to about 20 mole % of other alkali oxides;

up to about 25 mole % alkaline earth oxides such as BaO, SrO, MgO, CaO, to stabilize glass without increasing the alkali oxides content, and particularly BaO, to increase the refractive index of the glass component without increasing the temperature necessary for sintering the glass frit;

up to about 5 mole % $Sb_2O_3$+$CeO_2$+$SnO_2$, to make the glass component clear without coloring it;

up to about 40 mole % $Al_2O_3$+$Y_2O_3$, for producing a crystallizing glass component;

up to about 25 mole % $La_2O_3$, to increase the refractive index of the glass component, to produce clear glass, and in special cases to crystallize La-AG phosphor;

up to 25 mole % of $La_2O_3$+$Lu_2O_3$+$Gd_2O_3$+$Tb_2O_3$+$Eu_2O_3$+$Pr_2O_3$, for producing a crystallizing glass that precipitates garnets with various red color temperature shifts, and particularly $Pr_2O_3$ to provide residual yellow color in the glass matrix itself;

up to about 60 mole % $Bi_2O_3$, $Te_{O2}$, $Ta_2O_5$, $Nb_2O_5$, $P_2O_5$, to increase the refractive index of the glass component, particularly $TeO_2$ and $Bi_2O_3$; and up to 25 mole % $TiO_2$+$ZrO_2$; to increase the refractive index of the glass component and to increase the durability of the glass component.

The present subject matter also includes the additions of anions (preferentially F, S and Se) to oxygen sites in the glass component to modulate optical properties, such as transparency, refractive index (RI), and reactivity with phosphors.

In several embodiments, the glass component is formed by firing a mixture of oxides comprising about 20-60 mole % $SiO_2$, 14-50 mole % ZnO, 3-28 mole % $B_2O_3$, and 1-21 mole % $K_2O$. In addition, the oxides can comprise about 1-25 mole % $Na_2O$; up to 20 mole % ($Li_2O$+$Cs_2O$+$Rb_2O$);

up to 25 mole % (BaO+MgO+CaO+SrO); up to 5 mole % ($Sb_2O_3$+$CeO_2$+$SnO_2$) as decolorizer; up to 40 mole % ($Y_2O_3$+$Al_2O_3$) especially for crystallizing compositions; up to 25 mole % ($La_2O_3$+$Lu_2O_3$+$Pr_2O_3$+$Gd_2O_3$+$Tb_2O_3$+ $Eu_2O_3$) as a modifier for precipitating different garnets as well as to increase the refractive index of glass; in this $La_2O_3$ is unique as it promotes all three functions of crystallization, giving clear glass, and increase the refractive index; up to 25 mole % ($TiO_2$+$ZrO_2$) for durability and increasing refractive index; and up to 25 mole % of anion modifiers, preferably F+S+Se, of these Fluorine (F) is most preferred.

Furthermore, the oxides can include up to 60 mole % of $Bi_2O_3$; up to 50 mole % $TeO_2$; and up to 50 mole % of pentavalent oxides such as ($Ta_2O_5$+$Nb_2O_5$+$P_2O_5$+$V_2O_5$) as refractive index enhancers. In one embodiment, the mixture of oxides is free of $V_2O_5$ due to hazardous nature of vanadium pentoxide raw material.

In one embodiment, the glass component is produced by firing a mixture comprising 33-50 mole % $SiO_2$, 15-20 mole % ZnO, 16-21 mole % $B_2O_3$, 2-5 mole % $K_2O$, 3-7 mole % $Na_2O$, up to 8 mole % or 0.1-8 mole % $Li_2O$, up to 20 mole % or 0.5-20 mole % BaO, up to 6 mole %, up to 5 mole %, 0.1-5 mole %, or 0.1-1.0 mole % $Sb_2O_3$, and up to 19 mole % or 0.7-19 mole % $Al_2O_3$.

In several embodiments, the oxides and glass component are free of intentionally added lead-containing oxide or lead. However, leaded glasses containing PbO may also be used.

In accordance with the present subject matter, Table 1 below provides a summary of several exemplary glass components A-G, and lists for each glass component, the mole % of various oxides prior to firing. Ranges from different columns A-G can be used to formulate a glass component in accordance with the present subject matter.

titania, titanates, magnesium silicate, calcium silicate, strontium silicate, barium silicate, magnesium titanate, calcium titanate, strontium titanate, barium titanate, eucryptite (both the α- and β-forms are suitable), cordierite, cobalt oxide, chromium oxide, tungsten oxide, zinc oxide, cristobalite (both the α- and β-forms are suitable), zircon, and zirconia, among others.

The oxides may be fired and quenched to produce a non-crystallizing or crystallizing glass component, which can then be sized, such as by milling or grinding, to form glass frit. Where non-crystallizing frit is included in the ceramic slurry for the PiG active layer, phosphor can be mixed as a separate component into the ceramic slurry so as to be at 5-95 wt % of the active layer. In several embodiments, such as when incorporated into a blue LED package, the amount of phosphor should be sufficient, with respect to the thickness of the PiG active layer, for converting the blue light from an LED chip to white light of the desired color temperature and intensity.

In certain compositional ranges, the glass component of the active layer includes the crystallizing glass, wherein mixing of a separate phosphor may not be required to produce PiG active layer. In other compositional ranges, the glass component of the various layers of the cover each includes a non-crystallizing glass, wherein a separate phosphor may be included with ceramic slurry to produce the PiG active layer. For these crystallizing and non-crystallizing glass components, different compositional ranges for the glass can be optimized. It will be understood that the disclosed glass systems can include one or both of these functionalities.

The phosphor that is either added to, or precipitated from, the glass component is not particularly limited by the present

TABLE 1

Mole % of Oxides by Glass Component Prior to Firing

| Oxides | Glass Component | | | | | | |
|---|---|---|---|---|---|---|---|
| | A | B | C | D | E | F | G |
| $SiO_2$ | 20-60 | 33-55 | 42-50 | 33-55 | 33-55 | 33-55 | 33-55 |
| ZnO | 14-50 | 15-35 | 15-20 | 15-35 | 15-35 | 15-35 | 15-35 |
| $B_2O_3$ | 3-28 | 5-25 | 16-21 | 5-25 | 5-25 | 5-25 | 5-25 |
| $K_2O$ | 1-21 | 2-18 | 2-5 | 2-18 | 2-18 | 2-18 | 2-18 |
| $Na_2O$ | 1-25 | 2-21 | 3-7 | 2-21 | 2-21 | 2-21 | 2-21 |
| $Li_2O$ + $Cs_2O$ + $Rb_2O$ | 0-20 | 0.1-15 | 0.1-8 | 0.1-15 | 0.1-15 | 0.1-15 | 0.1-15 |
| BaO + MgO + CaO + SrO | 0-25 | 0.1-22 | 0.5-20 | 0.1-22 | 0.1-22 | 0.1-22 | 0.1-22 |
| $Sb_2O_3$ + $CeO_2$ + $SnO_2$ | 0-5 | 0.1-5 | 0.1-0.6 | 0.1-5 | 0.1-5 | 0.1-5 | 0.1-5 |
| $Al_2O_3$ | 0.1-40 | 0.1-31 | 0.7-19 | 0.1-40 | 0.7-31 | 3-23 | 0.1-40 |
| $Y_2O_3$ | ≤40 | | | ≤40 | 1-35 | 3-23 | ≤40 |
| $La_2O_3$ + $Lu_2O_3$ + $Gd_2O_3$ + $Tb_2O_3$ + $Eu_2O_3$ + $Pr_2O_3$ | ≤25 | | | ≤25 | 0.1-25 | 3-18 | ≤25 |
| $Bi_2O_3$ | ≤60 | | | 14-70 | ≤75 | ≤60 | ≤60 |
| $TeO_2$ | ≤50 | | | ≤30 | ≤40 | ≤50 | 10-48 |
| $TiO_2$ + $ZrO_2$ | ≤25 | | | | | | |
| $Ta_2O_5$ + $Nb_2O_5$ + $P_2O_5$ + $V_2O_5$ | ≤50 | | | | | | |
| F + S + Se | ≤25 | 05-15 | | ≤25 | ≤25 | ≤25 | ≤25 |

Additional amounts of inorganic fillers, usually crystalline oxides, may be added to affect the flow temperature and other properties of the glass component above the Tg. Such crystalline oxides may also act as nucleating agents to promote partial or local crystallization, such as for crystallizing phosphors. Suitable fillers include alumina, anorthite, bismuth oxide, boron oxide, fused silica, crystalline silica (i.e., quartz), magnesium cobalt spinel, molybdenum oxide, subject matter and can comprise $Ce^{3+}$ doped garnet phosphors, nitride and oxynitride phosphors, and oxide, oxyhalide and halide phosphors; including, but is not limited to: $Y_3Al_5O_{12}$:$Ce^{3+}$ (Ce:YAG); $Y_3Al_5O_{12}$:$Ce^{3+}$, CaS:$Eu_2$+; $Y_3Al_5O_{12}$:$Ce^{3+}$, $Sr_2Si_5N_8$:$Eu^{2+}$; $Sr_2GaS_4$:$Eu^{2+}$, SrS:$Eu^{2+}$; $Sr_2GaS_4$:$Eu^{2+}$, (Ca,Sr)S:$Eu^{2+}$; $Ca_3Sc_2Si_3O_{12}$:$Ce^{3+}$, CaAlSiN$_3$:$Eu^{2+}$; $SrSi_2O_2N_2$:$Eu^{2+}$; $Sr_2Si_5N_8$:$Eu^{2+}$; $SrSi_2O_2N_2$:$Eu^{2+}$, CaSiN$_2$:$Ce^{3+}$; (Sr,Ca)$_3$(Al,Si)O$_4$(O,F):

$Ce^{3+}$, $K_2TiF_6:Mn4+$; $BaSi_2O_2N_2:Eu^{2+}$, $\beta$-SiAlON:$Eu^{2+}$, Ca-$\alpha$-SiAlON:$Eu^{2+}$, $CaAlSiN_3:Eu^{2+}$; $BaSi_2O_2N_2:Eu^{2+}$; $\beta$-SiAlON:$Eu^{2+}$, Ca-$\alpha$-SiAlON:$Eu^{2+}$, $CaAlSiN_3:Eu^{2+}$; $BaMgAl_{10}O_{17}:Eu^{2+}$, $Ca_9La(PO_4)_7:Eu^{2+},Mn^{2+}$; $CaSi_2O_2N_2$:$Eu^{2+}$; $Sr_5Al_{5+x}Si_{21-x}N_{35-x}O_2+x:Eu^{2+}$ (with x~0); $SrAlSi_4N_7$:$Eu^{2+}$; $Ba_2AlSi_5N_9:Eu^{2+}$; $Ba_3Si_6O_{12}N_2:Eu_{2+}$; $Ba_2SiO_4:Eu^{2+}$; $Sr_2LaAlO_5:Ce^{3+}$; $Sr_3SiO_5:Ce^{3+}$; $M_2SiO_4:Eu^{2+}$ (with M=$Ba^{2+}$, $Sr^{2+}$, $Ca^{2+}$); and combinations thereof.

The size of the phosphor particles (e.g. crystals) are not particularly limited by the present subject matter, and can range from about 5-30 μm. Smaller size phosphor crystals may dissolve in the glass matrix to a greater extent upon being exposed to sintering temperatures, and thus blue light from an LED chip for example, may not be adequately converted to yellow light.

Conversely, larger phosphor particles may not adequately fill up the bulk of the PiG active layer, wherein the thickness of the PiG active layer is relatively small compared to the size of the phosphor particles, and therefore the PiG active layer may average only a single layer of phosphor particles in cross-section, and therefore have a significant fraction of the cross-sectional area of the PiG active layer being void of phosphor. Such an arrangement may result in a large percentage of blue light from a blue LED chip being transmitted directly through the active layer, between the phosphor particles, and without being absorbed by the phosphor and without being converted to yellow light. The light emitted from such an LED package may undesirably have a cold color temperature.

In several embodiments, the size of the phosphor particles relative to the thickness of the PiG active layer is such that the PiG active layer includes 1-10 layers of phosphor particles. This arrangement increases the probability that a large portion of the blue light from the LED chip will be absorbed in at least one layer of phosphor particles and be converted to yellow light.

The refractive index of the phosphor particles is also not particularly limited by the present subject matter, and may be the same as the RI of the glass matrix, or may differ by about ±0.01-0.3. In one embodiment, the refractive index of the phosphor is about 1.7 and the RI of the glass matrix is about 1.5-1.6. In this embodiment, the light from the LED chip may not simply travel in a straight line though the phosphor containing layer, only being absorbed by the phosphor particles that lie in that particular line of travel. Rather, a portion of the light may be reflected or refracted within the PiG active layer at the glass matrix/phosphor interfaces. Such reflection and refraction are dependent on the difference in RI between the glass matrix and the phosphor. The reflected portion of the light may thereby diverge along a longer, more tortuous path within the PiG active layer and at different angles from the incident ray. Accordingly, the light from the LED chip has more opportunity to encounter and be absorbed by phosphor particles within the PiG active layer and to be converted to yellow light.

Many other benefits will no doubt become apparent from future application and development of this technology.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scopes of the claimed subject matter, as expressed in the appended claims.

The invention is further defined by the following items.

Item 1. A phosphor in glass (PiG) cover including an active layer of glass and phosphor, and a secondary layer contacting the active layer and including glass and being free of phosphor.

Item 2. An LED package including the PiG cover according to claim 1, and an LED chip that emits light through the PiG cover.

Item 3. A method of making the PiG cover according to claim 1, the method including:
providing a first green tape layer including glass frit and phosphor;
providing a second green tape layer including glass frit and no phosphor; and
laminating the first green tape layer to the second green tape layer to thereby produce the PiG cover.

Item 4. A method of making an LED package, the method including:
providing a first green tape layer including glass frit and phosphor;
providing a second green tape layer including glass frit and no phosphor; and
laminating the first green tape layer to the second green tape layer to thereby produce the PiG cover; and
arranging an LED chip under the PiG cover such that light emitted by the LED chip is transmitted through the PiG cover.

The invention claimed is:

1. A phosphor in glass (PiG) cover including an active layer comprising a glass and phosphor, and a secondary layer contacting the active layer and including the glass and being free of phosphor, wherein the glass comprises 20-60 mol % $SiO_2$, 14-50 mol % ZnO, 3-28 mol % $B_2O_3$ and 1-21 mol % $K_2O$.

2. The PiG cover according to claim 1, further comprising a second active layer in direct contact with the active layer, wherein the second active layer comprises the glass and phosphor.

3. The PiG cover according to claim 2, wherein the active layer and the second active layer are stacked together.

4. The PiG cover according to claim 2, wherein the active layer and the second active layer are disposed side-by-side.

5. The PiG cover according to claim 2, wherein the phosphor in the second active layer is different from the phosphor in the first active layer.

6. The PiG cover according to claim 1, further comprising a second secondary layer free of phosphor, wherein the active layer is sandwiched between the secondary layer and the second secondary layer.

7. The PiG cover according to claim 2, further comprising a second secondary layer free of phosphor, wherein the active layer is sandwiched between the secondary layer and the second secondary layer.

8. The PiG cover according to claim 1, wherein the glass has a refractive index of about 1.55-1.60.

9. An LED package including the PiG cover according to claim 1, and an LED chip that emits light through the PiG cover.

10. The LED package according to claim 9, wherein the LED chip is positioned underneath the PiG.

11. The LED package according to claim 9, wherein the secondary layer of the PiG is arranged on the same side of the active layer as the LED chip.

12. The LED package according to claim 9, wherein the glass in the PiG cover has a refractive index of about 1.55-1.60.

13. The PiG cover according to claim 1, wherein the glass further comprises:
   about 1-25 mole % $Na_2O$;
   up to 20 mole % $(Li_2O+Cs_2O+Rb_2O)$;
   up to 25 mole % $(BaO+MgO+CaO+SrO)$;
   up to 5 mole % $(Sb_2O_3+CeO_2+SnO_2)$;
   up to 40 mole % $(Y_2O_3+Al_2O_3)$;
   up to 25 mole % $(La_2O_3+Lu_2O_3+Pr_2O_3+Gd_2O_3+Tb_2O_3+Eu_2O_3)$;
   up to 25 mole % $(TiO_2+ZrO_2)$; and
   up to 25 mole % of anion modifiers.

14. The PiG cover according to claim 13, wherein the anion modifier comprises F+S+Se.

15. The PiG cover according to claim 1, wherein the size of the phosphor ranges 5-30 micron.

16. The PiG cover according to claim 1, wherein a refractive index of the phosphor is same as or differ by ±0.01-0.3 from the refractive index of the glass of the active layer.

17. The PiG cover according to claim 1, wherein the active layer has thickness of about 120 μm, and the secondary layer has thickness of about 25-100 μm.

18. The PiG cover according to claim 1, further comprising inorganic filler selected from alumina, anorthite, bismuth oxide, boron oxide, fused silica, crystalline silica (i.e., quartz), magnesium cobalt spinel, molybdenum oxide, titania, titanates, magnesium silicate, calcium silicate, strontium silicate, barium silicate, magnesium titanate, calcium titanate, strontium titanate, barium titanate, eucryptite (both the α- and β-forms are suitable), cordierite, cobalt oxide, chromium oxide, tungsten oxide, zinc oxide, cristobalite (both the α- and β-forms are suitable), zircon, or zirconia.

* * * * *